(12) United States Patent
Ikeda et al.

(10) Patent No.: US 12,641,717 B2
(45) Date of Patent: May 26, 2026

(54) WIRING CIRCUIT BOARD AND METHOD FOR PRODUCING WIRING CIRCUIT BOARD

(71) Applicant: NITTO DENKO CORPORATION, Osaka (JP)

(72) Inventors: Takahiro Ikeda, Osaka (JP); Teppei Niino, Osaka (JP); Shusaku Shibata, Osaka (JP); Shoei Tetsukawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 336 days.

(21) Appl. No.: 18/532,910

(22) Filed: Dec. 7, 2023

(65) Prior Publication Data

US 2024/0206053 A1 Jun. 20, 2024

(30) Foreign Application Priority Data

Dec. 14, 2022 (JP) ................................. 2022-199808

(51) Int. Cl.
 *H05K 1/02* (2006.01)
 *H05K 3/00* (2006.01)
(52) U.S. Cl.
 CPC ........... *H05K 1/0278* (2013.01); *H05K 3/007* (2013.01); *H05K 2201/09063* (2013.01)

(58) Field of Classification Search
 CPC ........ H05K 1/02; H05K 1/0278; H05K 1/056; H05K 3/06; H05K 3/061; H05K 1/028
 USPC ......................................................... 174/254
 See application file for complete search history.

(56) References Cited

U.S. PATENT DOCUMENTS

2016/0055870 A1 2/2016 Someya et al.
2022/0102417 A1 3/2022 Park et al.
2023/0156911 A1 5/2023 Tanaka et al.

FOREIGN PATENT DOCUMENTS

JP 2016-045975 A 4/2016
JP 2022-520370 A 3/2022
WO 2021/161976 A1 8/2021

*Primary Examiner* — Tremesha W Burns
(74) *Attorney, Agent, or Firm* — Edwards Neils LLC; Jean C. Edwards, Esq.

(57) ABSTRACT

A method for producing a wiring circuit board includes a step (1) of producing a substrate with a metal support board including a metal support board and a step (2) of etching the metal support board. The wiring circuit board includes a frame, a mounting portion, an opening portion, and a joint. Each of the frame and the mounting portion includes a metal support layer, a base insulating layer, a conductive layer, and a cover insulating layer. The joint does not include the metal support layer. In step (2), by etching the metal support board corresponding to the opening portion and the joint from the other side in the thickness direction by using an etching resist, the metal support layer is formed.

5 Claims, 7 Drawing Sheets

1

100

1

1

1

1

WIRING CIRCUIT BOARD AND METHOD FOR PRODUCING WIRING CIRCUIT BOARD

CROSS-REFERENCE TO RELATED APPLICATION

The present application claims priority from Japanese Patent Application No. 2022-199808 filed on Dec. 14, 2022, the contents of which are hereby incorporated by reference into this application.

TECHNICAL FIELD

The present invention relates to a wiring circuit board, and a method for producing a wiring circuit board.

BACKGROUND ART

A wiring circuit board including a frame, a mounting portion, a joint, and an opening portion is known (ref: for example, Patent Document 1 below).

In the wiring circuit board described in Patent Document 1, the mounting portion is surrounded by the frame across the opening portion. The mounting portion is supported by the frame through the joint. The joint traverses the opening portion.

Each of the frame and the mounting portion includes a metal support layer, a base insulating layer, a conductive layer, and a cover insulating layer in order toward one side in a thickness direction. The joint does not include the metal support layer, and includes the base insulating layer, the conductive layer, and the cover insulating layer in order toward one side in the thickness direction.

CITATION LIST

Patent Document

Japanese Unexamined Patent Application Publication No. 2022-520370

SUMMARY OF THE INVENTION

Problem to be Solved by the Invention

A method for producing a wiring circuit board described in Patent Document 1 includes a step (1) of producing a substrate with a metal support board which includes a metal support board, and a step (2) of etching the metal support board. The substrate with a metal support board produced in the step (1) includes the metal support board, the base insulating layer, the conductive layer, and the cover insulating layer. In the step (2), by etching the metal support board, the metal support layer is formed from the metal support board.

Then, in the step (2), in order to improve production efficiency, the metal support board corresponding to the opening portion and the joint is etched from both sides of one side and the other side in the thickness direction.

In the etching, an etching resist is used. The etching resist is disposed at both sides in the thickness direction of portions corresponding to the frame and the mounting portion in the substrate with a metal support board. On the other hand, the etching resist is not disposed at either side in the thickness direction of the portions corresponding to the joint and the opening portion.

Then, there is a problem that the portions corresponding to the joint and the opening portion in the substrate with a metal support board are collided with an etching solution from both sides of one side and the other side in the thickness direction to be damaged and/or detached. The damage includes deformation.

Further, the metal support layer in the produced wiring circuit board has two side surfaces defining the opening portion. The two side surfaces are opposite to each other. The other end portions of the two side surfaces in the thickness direction are likely to form a pointed portion. Therefore, there is a problem that the above-described other end portion damages another member.

The present invention provides a method for producing a wiring circuit board capable of suppressing damage and/or detachment of a joint in a step (2), and a wiring circuit board capable of suppressing damage to another member by two side surfaces in a metal support layer.

Means for Solving the Problem

The present invention [1] includes a method for producing a wiring circuit board including a step (1) of producing a substrate with a metal support board including a metal support board and a step (2) of etching the metal support board in order, wherein the wiring circuit board includes a frame, a mounting portion spaced from the frame and surrounded by the frame, an opening portion disposed between the frame and the mounting portion, and a joint connecting the frame to the mounting portion and traversing the opening portion; each of the frame and the mounting portion includes a metal support layer, a base insulating layer, a conductive layer, and a cover insulating layer in order toward one side in a thickness direction; the joint does not include the metal support layer, and includes the base insulating layer, the conductive layer, and the cover insulating layer in order toward one side in the thickness direction; the substrate with a metal support board includes the metal support board including the metal support layer, the base insulating layer, the conductive layer, and the cover insulating layer; and in the step (2), by etching the metal support board corresponding to the opening portion and the joint from the other side in the thickness direction by using an etching resist, the metal support layer is formed.

According to the method for producing a wiring circuit board, in the step (2), the metal support board corresponding to the opening portion and the joint is etched from the other side in the thickness direction by using the etching resist. That is, the etching resist is disposed at one side of the base insulating layer, the conductive layer, and the cover insulating layer in the thickness direction corresponding to the opening portion and the joint. Then, the joint is supported from one side in the thickness direction by the above-described etching resist. Therefore, even when the joint is collided with the etching solution from the other side in the thickness direction, it is possible to suppress damage and/or detachment.

Furthermore, since the metal support layer corresponding to the opening portion is collided with the etching from the other side in the thickness direction in the step (2), the two side surfaces defining the opening portion has an inclined shape approaching each other toward one side in the thickness direction. Therefore, formation of the pointed portion at the other end portion of the two side surfaces in the thickness direction is suppressed.

The present invention [2] includes the method for producing a wiring circuit board described in [1], wherein the step (2) includes a step (3) of disposing a patch board at one side of the substrate with a metal support board in the thickness direction, a step (4) of etching the metal support board, and a step (5) of removing the patch board.

According to the method for producing a wiring circuit board, in the step (4), it is possible to support the substrate with a metal support board by the patch board. Therefore, the damage and/or the detachment of the joint are/is more effectively suppressed.

The present invention [3] includes the method for producing a wiring circuit board described in [2], wherein the patch board has non-pressure-sensitive adhesiveness.

In the method for producing a wiring circuit board, since the patch board has the non-pressure-sensitive adhesiveness, it is possible to smoothly and easily remove the patch board in the step (5). Thus, it is possible to improve production efficiency of the wiring circuit board.

The present invention [4] includes the method for producing a wiring circuit board described in any one of [1] to [3], wherein the frame has a side at an inner peripheral edge of the frame, the joint includes a first connecting portion to which the joint is connected at the side, and a ratio (length of the first connecting portion/length of the side) of the length of the first connecting portion in a direction along the side to the length of the side is 0.3 or less.

Since the ratio of the length of the first connecting portion in the direction along the side to the length of the side is 0.3 or less, the first connecting portion in the direction along the side is narrowed. Then, strength of the first connecting portion in the joint is reduced. Therefore, in the step (2), the joint is likely to be deformed and/or detached. However, in the method for producing a wiring circuit board, since in the step (2), the metal support board is etched from the other side in the thickness direction, while the joint is supported from one side in the thickness direction by the etching resist, it is possible to further suppress deformation and/or the detachment of the joint.

The present invention [5] includes the method for producing a wiring circuit board described in any one of [1] to [4], wherein the mounting portion has a side at an outer peripheral edge of the mounting portion, the joint includes a second connecting portion to which the joint is connected at the side, and a ratio (length of the second connecting portion/length of the side) of the length of the second connecting portion in a direction along the side to the length of the side is 0.3 or less.

Since the ratio of the length of the second connecting portion in the direction along the side to the length of the side is 0.3 or less, the second connecting portion in the direction along the side is narrowed. Then, the strength of the second connecting portion in the joint is reduced. Therefore, in the step (2), the joint is likely to be deformed and/or detached. However, in the method for producing a wiring circuit board, since in the step (2), the metal support board is etched from the other side in the thickness direction, while the joint is supported from one side in the thickness direction by the etching resist, it is possible to further suppress the deformation and/or the detachment of the joint.

The present invention [6] includes a wiring circuit board including a frame, a mounting portion supported by the frame and spaced from the frame, an opening portion disposed between the frame and the mounting portion, and a joint connecting the frame to the mounting portion and traversing the opening portion, wherein each of the frame and the mounting portion includes a metal support layer, a base insulating layer, a conductive layer, and a cover insulating layer in order toward one side in the thickness direction; the joint does not include the metal support layer, and includes the base insulating layer, the conductive layer, and the cover insulating layer in order toward one side in the thickness direction; the metal support layer has two side surfaces defining the opening portion and being opposite to each other; and the two side surfaces have an inclined shape approaching each other toward one side in the thickness direction.

In the wiring circuit board, since the two side surfaces have the inclined shape approaching each other toward one side in the thickness direction, the formation of the pointed portion at the other end portions of the two side surfaces in the thickness direction is suppressed. Therefore, it is possible to suppress the damage to the other member by the two side surfaces.

Effect of the Invention

In the method for producing a wiring circuit board of the present invention, in a step (2), it is possible to suppress damage and/or detachment of a joint.

According to the wiring circuit board of the present invention, it is possible to suppress the damage to another member by two side surfaces in a metal support layer.

BRIEF DESCRIPTION OF THE DRAWINGS

FIG. 4A illustrating a step (1),

FIG. 4B illustrating a step of disposing an etching resist in a step (2),

FIG. 4C illustrating a step (4) of etching a metal support board,

FIG. 4D illustrating a step of removing an etching resist, and

FIG. 4E illustrating a step of mounting an imaging element and an external board on the wiring circuit board.

FIG. 5A illustrating a step of disposing an etching resist in a step (2), and a step (3) of disposing a patch board, FIG. 5B illustrating a step (4) of etching a metal support board, FIG. 5C illustrating step (5) of removing the patch board, and FIG. 5D illustrating a step of removing the etching resist in the step (2).

DESCRIPTION OF EMBODIMENTS

1. Wiring Circuit Board 1

A wiring circuit board produced by one embodiment of a method for producing a wiring circuit board of the present invention is described with reference to FIGS. 1 to 3.

Figure 1:
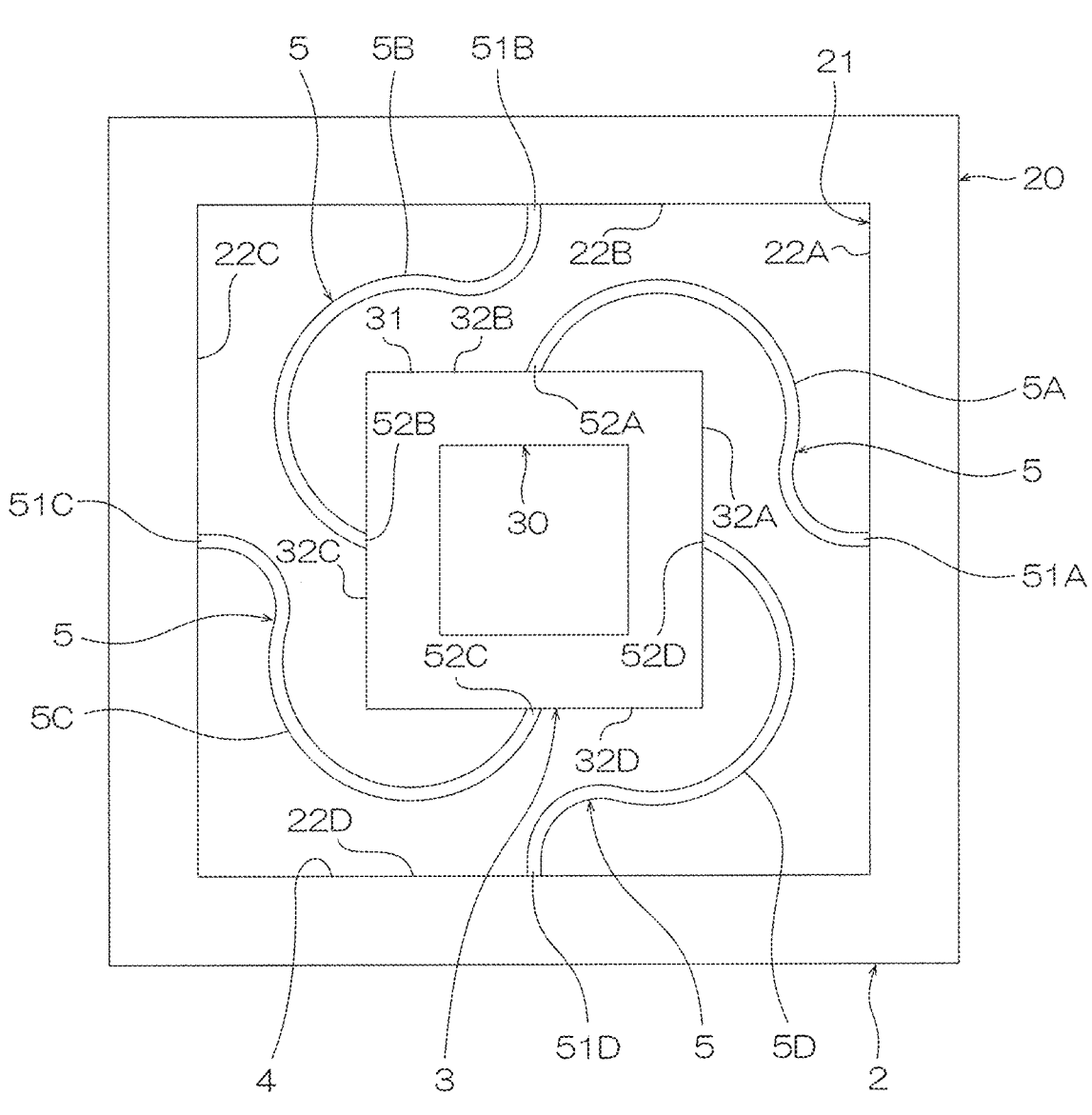
FIG. 1 shows a plan view of a wiring circuit board produced by one embodiment of a method for producing a wiring circuit board of the present invention.
Figure 2:
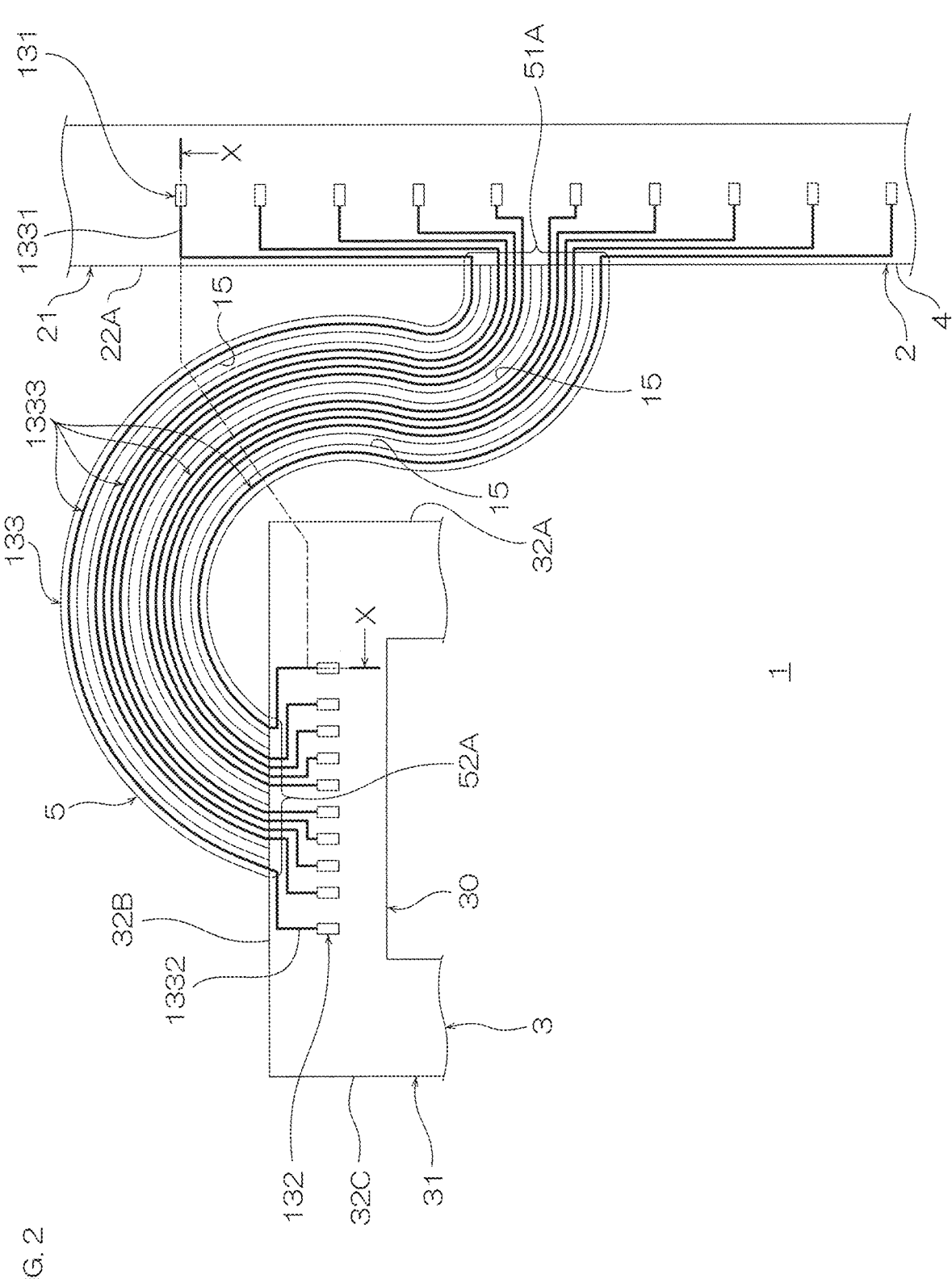
FIG. 2 shows an enlarged view of a joint of the wiring circuit board shown in FIG. 1.

As shown in FIG. 1, a wiring circuit board 1 has a sheet shape. As shown in FIG. 3, the wiring circuit board 1 has a thickness. As shown in FIG. 1, the wiring circuit board 1 extends in a plane direction. The plane direction is perpendicular to a thickness direction. The wiring circuit board 1 includes a frame 2, a mounting portion 3, an opening portion 4, and a joint 5.

1.1 Frame 2

In the present embodiment, the frame 2 has a generally rectangular frame shape. The frame 2 includes an outer peripheral edge 20 and an inner peripheral edge 21. In the present embodiment, the frame 2 has four sides 22A, 22B, 22C, and 22D at the inner peripheral edge 21. The four sides 22A, 22B, 22C, and 22D are disposed in order counterclockwise when viewed from the top. The side 22A and the side 22C are opposite to each other. The side 22B connects one end portion of the side 22A to one end portion of the side 22C. The side 22D connects the other end portion of the side 22A to the other end portion of the side 22C. The side 22B and the side 22D are opposite to each other.

An external dimension of the frame 2 is not limited. Each of an interval between the side 22A and the side 22C and the interval between the side 22B and side 22D is, for example, 5 mm or more, preferably 8 mm or more, and for example, 50 mm or less, preferably 30 mm or less. Each length of the sides 22A, 22B, 22C, and 22D is, for example, 5 mm or more, preferably 8 mm or more, and for example, 50 mm or less, preferably 30 mm or less. A width of the frame 2 is, for example, 0.1 mm or more, preferably 0.3 mm or more, and for example, 50 mm or less, preferably 30 mm or less. The width of the frame 2 is the length between the outer peripheral edge 20 and the inner peripheral edge 21.

1.2 Mounting Portion 3

The mounting portion 3 is surrounded by the frame 2 when viewed from the top. The mounting portion 3 is spaced from the frame 2. The mounting portion 3 has a generally rectangular frame shape. The mounting portion 3 includes an inner peripheral edge 30 and an outer peripheral edge 31. The mounting portion 3 has a plurality of sides 32A, 32B, 32C, and 32D at the outer peripheral edge 31.

The four sides 32A, 32B, 32C, and 32D are disposed in order counterclockwise when viewed from the top. Each of the sides 32A, 32B, 32C, and 32D of the mounting portion 3 faces each of the sides 22A, 22B, 22C, and 22D of the frame 2, respectively.

The side 32B of the mounting portion 3 faces (is opposite to) the side 22B of the frame 2. In other words, the side 22B is an opposite side to the side 32B. The side 32B extends in the same direction as the side 22B.

The side 32B of the mounting portion 3 does not face (is not opposite to) the side 22A of the frame 2. In other words, the side 22A is a non-opposite side to the side 32B. The side 32B is adjacent to the side 32A. The side 32B extends in a direction perpendicular to the side 22A.

The side 32C is along the same direction as the side 32A. The side 32B connects one end portion of the side 32A to one end portion of the side 32C. The side 22C is a non-opposite side to the side 32B. The side 32D connects the other end portion of the side 32A to the other end portion of the side 32C. The side 32D is along the same direction as the side 32B. The side 22D is a non-opposite side to the side 32C. The side 22A is a non-opposite side to the side 32D.

The external dimension of the mounting portion 3 is not limited. Each of the interval between the side 32A and the side 32C and the interval between the side 32B and the side 32D is, for example, 3 mm or more, preferably 5 mm or more, and for example, 50 mm or less, preferably 30 mm or less. Each length of the sides 32A, 32B, 32C, and 32D is, for example, 3 mm or more, preferably 5 mm or more, and for example, 50 mm or less, preferably 30 mm or less.

The width of the mounting portion 3 is, for example, 0.3 mm or more, preferably 0.5 mm or more, and for example, 30 mm or less, preferably 20 mm or less. The width of the mounting portion 3 is the length between the inner peripheral edge 30 and the outer peripheral edge 31.

1.3 Opening Portion 4

The opening portion 4 is disposed between the frame 2 and the mounting portion 3. The opening portion 4 penetrates the wiring circuit board 1 in the thickness direction.

1.4 Joint 5

The joint 5 is, for example, disposed between the frame 2 and the mounting portion 3. The joint 5 connects the frame 2 to the mounting portion 3. The joint 5 traverses the opening portion 4. Thus, the mounting portion 3 is supported by the frame 2 through the joint 5.

The joint 5 has a curved shape when viewed from the top. In the present embodiment, the joint 5 preferably does not have a linear shape and/or a bent shape, and has only the curved shape. Specifically, the joint 5 has an S shape or a hook shape.

The plurality of joints 5 corresponding to the plurality of sides 22A, 22B, 22C, and 22D in the frame 2 are provided. The plurality of joints 5 include joints 5A, 5B, 5C, and 5D.

In the present embodiment, the joint 5A connects the side 22A to the side 32B. The joint 5B connects the side 22B to the side 32C. The joint 5C connects the side 22C to the side 32D. The joint 5D connects the side 22D to the side 32A.

The joints 5A, 5B, 5C, and 5D have first connecting portions 51A, 51B, 51C, and 51D, respectively, to be connected to the plurality of sides 22A, 22B, 22C, and 22D in the frame 2. Further, the joints 5A, 5B, 5C, and 5D have second connecting portions 52A, 52B, 52C, and 52D, respectively, to be connected to the plurality of sides 32B, 32C, 32D, and 32A in the mounting portion 3.

In the present embodiment, each of the first connecting portions 51A, 51B, 51C, and 51D is located at a central portion of each of the sides 22A, 22B, 22C, and 22D in a direction in which each of the sides 22A, 22B, 22C, and 22D extends. Each of the second connecting portions 52A, 52B, 52C, and 52D is located at the central portion of each of the sides 32B, 32C, 32D, and 32A in a direction in which each of the sides 32B, 32C, 32D, and 32A extends.

A ratio (length of the first connecting portion 51A/length of the side) of the length of the first connecting portion 51A in a direction along the side 22A to the length of the side 22A is, for example, 0.3 or less, preferably 0.25 or less, more preferably 0.2 or less, and for example, 0.01 or more. When the ratio of the length of the first connecting portion 51A in the direction along the side 22A to the length of the side 22A is the above-described upper limit or less, the first connecting portion 51A in the direction along the side 22A is narrowed. Then, the strength of the first connecting portion 51A in the joint 5A is reduced. Therefore, in a step (2) of a production method to be described later, the joint 5A is likely to be deformed and/or detached. However, in the present embodiment, since in the step (2), a metal support board 10 is etched from the other side in the thickness direction, while the joint 5 is supported from one side in the thickness direction by a first resist 161 (described later), it is possible to further suppress deformation and/or the detachment of the joint 5A. Each of the ratio of the length of the first connecting portion 51B, the ratio of the length of the first connecting portion 51C, and the ratio of the length of the first connecting portion 51D is the same as the ratio of the length of the first connecting portion 51A described above.

The ratio (length of the second connecting portion 52A/length of the side 32B) of the length of the second connecting portion 52A in a direction along the side 32B to the length of the side 32B is, for example, 0.3 or less, preferably 0.25 or less, more preferably 0.2 or less, and for example, 0.01 or more. When the ratio of the length of the second connecting portion 52A in the direction along the side 32B to the length of the side 32B is the above-described upper limit or less, the second connecting portion 52A is narrowed in a direction in which the side 32B extends.

Then, the strength of the second connecting portion 52A in the joint 5A is reduced. Therefore, in the step (2) of the production method to be described later, the joint 5A is likely to be deformed and/or detached. However, in the present embodiment, since in the step (2), the metal support board 10 is etched from the other side in the thickness direction, and the joint 5 is supported from one side in the thickness direction by the first resist 161 (described later), it is possible to further suppress the deformation and/or the detachment of the joint 5A. Each of the ratio of the length of the second connecting portion 52B, the ratio of the length of the second connecting portion 52C, and the ratio of the length of the second connecting portion 52D is the same as the ratio of the length of the second connecting portion 52A described above.

1.5 Layer Configuration of Wiring Circuit Board 1

Figure 3:
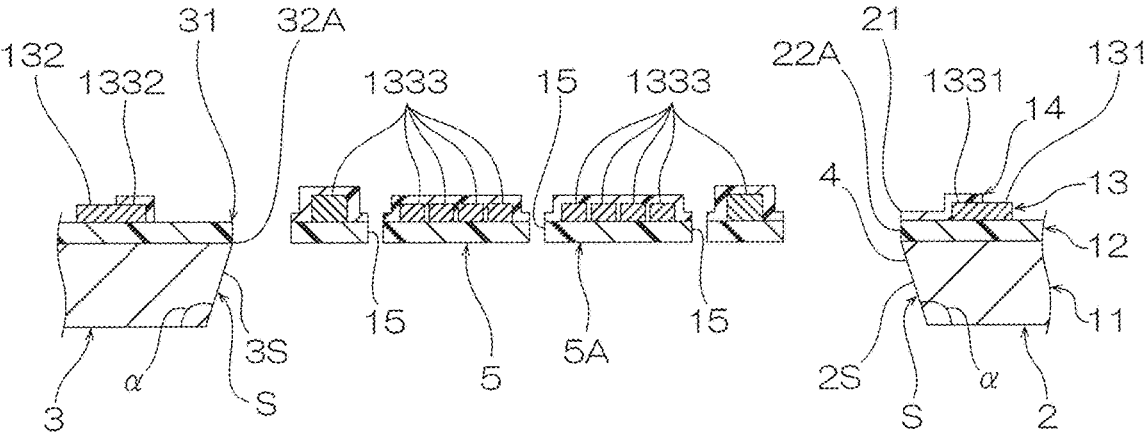
FIG. 3 shows a cross-sectional view of the joint shown in FIG. 2 along an XX line.
Figure 3:

As shown in FIG. 3, the wiring circuit board 1 includes a metal support layer 11, a base insulating layer 12, a conductive layer 13, and a cover insulating layer 14 in order toward one side in the thickness direction.

1.5.1 Metal Support Layer 11

The metal support layer 11 is provided in the frame 2 and the mounting portion 3. The metal support layer 11 forms an outer shape of the frame 2 and the mounting portion 3. The metal support layer 11 extends in the plane direction. The metal support layer 11 is disposed at the other end portions of the frame 2 and the mounting portion 3 in the thickness direction.

The metal support layer 11 has two side surfaces S. The two side surfaces S include an inner-side surface 2S and an outer-side surface 3S. The inner-side surface 2S is included in the inner peripheral edge 21 of the frame 2. The outer-side surface 3S is included in the outer peripheral edge 31 of the mounting portion 3. The two side surfaces S define the opening portion 4. The two side surfaces S are opposite to each other. The two side surfaces S have an inclined shape approaching each other toward one side in the thickness direction. Each of the two side surfaces S is a tapered surface. The other end portions of the two side surfaces S in the thickness direction have an obtuse angle $\alpha$ in a cross-sectional view. The obtuse angle $\alpha$ is, for example, 95 degrees or more, preferably 100 degrees or more, and for example, 150 degrees or less. The obtuse angle $\alpha$ is the angle between the side surface S and the other surface of the metal support layer 11 in the thickness direction.

The metal support layer 11 has rigidity. Examples of a material for the metal support layer 11 include stainless steel, 42-alloy, aluminum, copper-beryllium, phosphor bronze, copper, silver, nickel, chromium, titanium, tantalum, platinum, gold, and copper alloys. As the material for the metal support layer 11, from the viewpoint of ensuring the strength of the frame 2 and the mounting portion 3, preferably, stainless steel and a copper alloy are used. A thickness of the metal support layer 11 is, for example, 30 μm or more, preferably 100 μm or more, and for example, 10000 μm or less, preferably 1000 μm or less.

1.5.2 Base Insulating Layer 12

The base insulating layer 12 is provided in the frame 2, the mounting portion 3, and the joint 5.

In the frame 2, the mounting portion 3, and the joint 5, the base insulating layer 12 is disposed on one surface of the metal support layer 11 in the thickness direction.

The base insulating layer 12 is disposed at the other end portion of the joint 5 in the thickness direction. The base insulating layer 12 in the joint 5 forms the outer shape of the joint 5.

The base insulating layer 12 has flexibility. Examples of the material for the base insulating layer 12 include resins, and preferably, a polyimide resin is used. The thickness of the base insulating layer 12 is, for example, 1 μm or more, preferably 5 μm or more, and for example, below 20 μm, preferably 15 μm or less.

1.5.3 Conductive Layer 13

The conductive layer 13 is provided in the frame 2, the mounting portion 3, and the joint 5.

In the frame 2 and the mounting portion 3, the conductive layer 13 is disposed on one surface of the base insulating layer 12 in the thickness direction. As shown in FIG. 2, the conductive layer 13 includes a first terminal 131, a second terminal 132, and a wiring 133.

The first terminal 131 is provided in the frame 2. The plurality of first terminals 131 are disposed spaced from each other in a direction in which the side 22A extends in the frame 2 corresponding to the side 22B. The first terminal 131 is also disposed in the same manner as the description above in the frame 2 corresponding to the sides 22A, 22C, and 22D.

The second terminal 132 is provided in the mounting portion 3. The plurality of second terminals 132 are disposed spaced from each other in a direction in which the side 32B extends in the mounting portion 3 corresponding to the side 32B. The second terminal 132 is also disposed in the same manner as the description above in the sides 32A, 32C, and 32D.

The wiring 133 includes a first terminal connection line 1331, a second terminal connection line 1332, and a joint wiring 1333.

The first terminal connection line 1331 is provided in the frame 2. The first terminal connection line 1331 extends from the first terminal 131 to the first connecting portion 51 (51A, 51B, 51C, 51D).

The second terminal connection line 1332 is provided in the mounting portion 3. The second terminal connection line 1332 extends from the second terminal 132 to the second connecting portion 52 (52A, 52B, 52C, 52D).

The joint wiring 1333 is provided in the joint 5. The joint wiring 1333 connects the first terminal connection line 1331 to the second terminal connection line 1332.

1.5.4 Cover Insulating Layer 14

As shown in FIG. 3, the cover insulating layer 14 is provided in the frame 2, the mounting portion 3, and the joint 5. The cover insulating layer 14 is disposed on one surface of the base insulating layer 12 in the thickness direction.

In the frame 2, the cover insulating layer 14 covers the first terminal connection line 1331, and exposes the first terminal 131.

In the mounting portion 3, the cover insulating layer 14 covers the second terminal connection line 1332, and exposes the second terminal 132.

The cover insulating layer 14, together with the base insulating layer 12, forms the outer shape of the joint 5. In the joint 5, the cover insulating layer 14 covers the joint wiring 1333. In the joint 5, the base insulating layer 12 and the cover insulating layer 14 may have a slit 15. As shown in FIG. 2, the slit 15 penetrates the base insulating layer 12 and the cover insulating layer 14 in the thickness direction. The slit 15 is along a direction in which the joint 5 extends. The one or two or more slits 15 are provided in the joint 5 in a pattern dividing the two or more joint wirings 1333.

As described above, each of the frame 2 and the mounting portion 3 includes the metal support layer 11, the base insulating layer 12, the conductive layer 13, and the cover insulating layer 14 in order toward one side in the thickness direction. The joint 5 does not include the metal support layer 11, and includes the base insulating layer 12, the conductive layer 13, and the cover insulating layer 14 in order toward one side in the thickness direction.

2. Method for Producing Wiring Circuit Board 1

The method for producing the wiring circuit board 1 is described with reference to FIGS. 4A to 4E.

The method for producing the wiring circuit board 1 includes the step (1) and the step (2) in order.

2.1 Step (1)

Figure 4A:
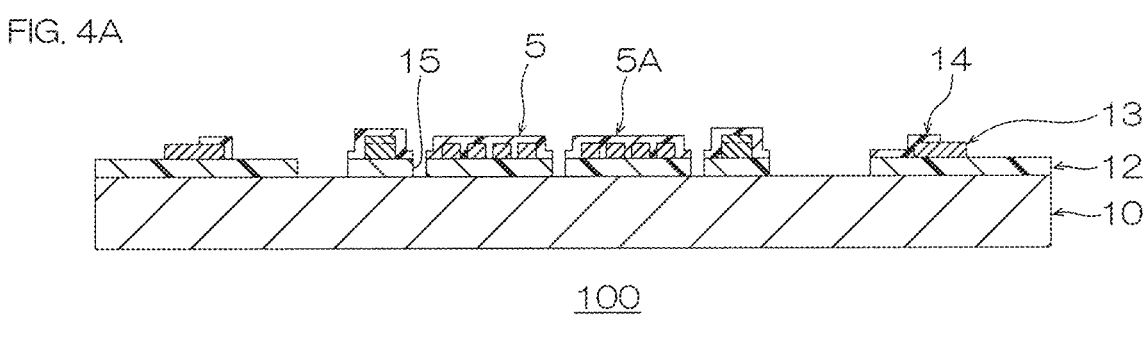
FIGS. 4A to 4E show process views of a method for producing a wiring circuit board.

As shown in FIG. 4A, in the step (1), a substrate 100 with a metal support board including the metal support board 10 is produced.

The substrate 100 with a metal support board includes the metal support board 10, the base insulating layer 12, the conductive layer 13, and the cover insulating layer 14. The metal support board 10 includes the metal support layer 11 when viewed from the top. Specifically, the metal support board 10 has a larger pattern than the metal support layer 11 when projected in the thickness direction. The metal support board 10 in the step (1) does not yet have the opening portion 4 (ref: FIGS. 4C to 4E). The metal support board 10 is also a carrier material supporting the base insulating layer 12, the conductive layer 13, and the cover insulating layer 14 from the other side in the thickness direction.

To produce the substrate 100 with a metal support board, first, the metal support board 10 is prepared, and next, the base insulating layer 12, the conductive layer 13, and the cover insulating layer 14 are formed in order on one side of the metal support board 10 in the thickness direction. Each of the base insulating layer 12 and the cover insulating layer 14 is formed, for example, by coating of a varnish containing a photosensitive resin composition and photolithography. Thus, the base insulating layer 12 and the cover insulating layer 14 are formed into a pattern having the slit 15. The conductive layer 13 is formed by a metal film forming method.

2.2 Step (2)

In the step (2), the metal support board 10 is etched.

Figure 4B:
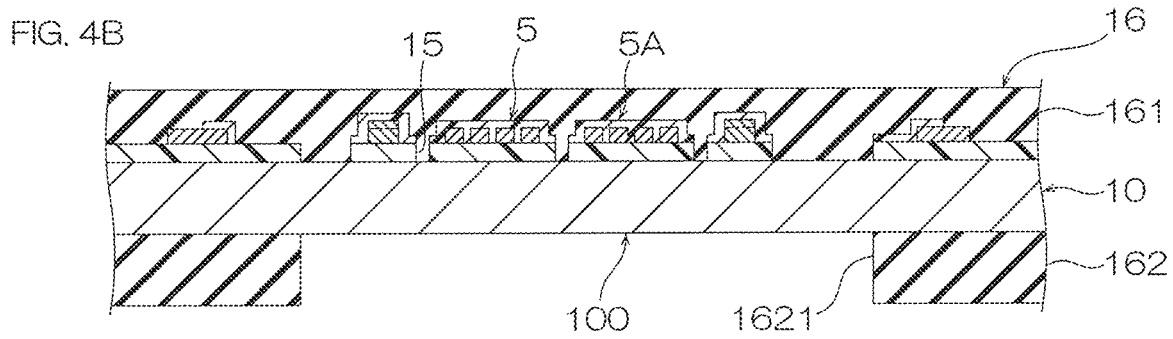
Figure 4C:
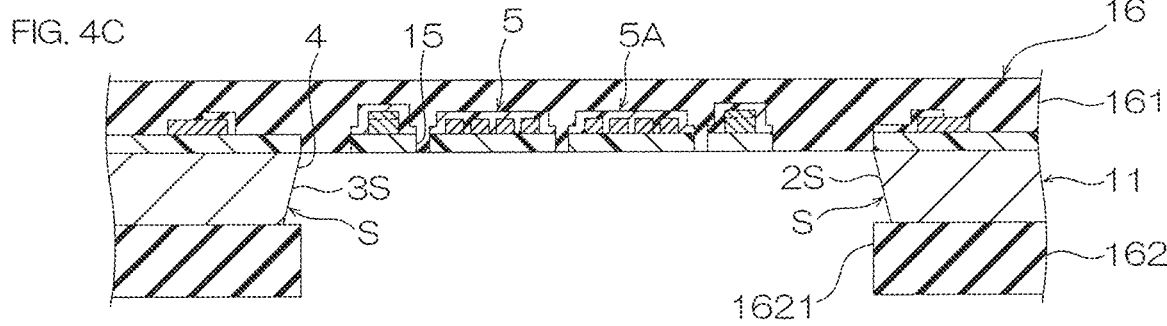
Figure 4D:
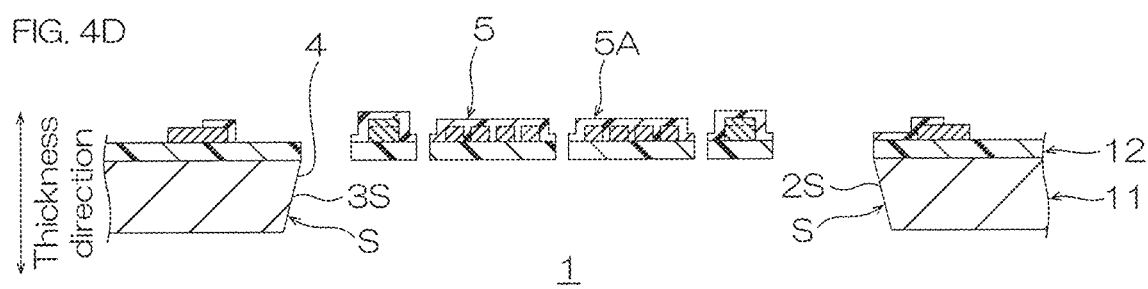
Figure 4E:
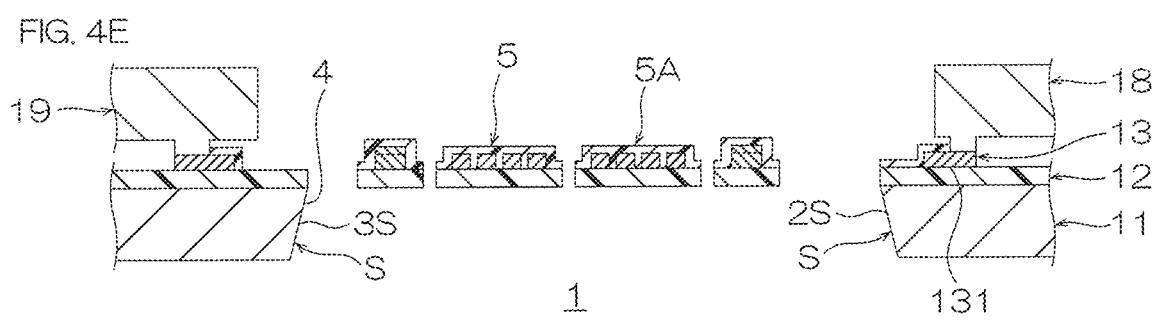

To etch the metal support board 10, first, as shown in FIG. 4B, an etching resist 16 is disposed on the substrate 100 with a metal support board. The etching resist 16 includes, for example, the first resist 161 and a second resist 162.

The first resist 161 is disposed on one surface of the substrate 100 with a metal support board in the thickness direction. The first resist 161 is disposed on one surface of the metal support board 10 in the thickness direction, one surfaces of the first terminal 131 and the second terminal 132 in the thickness direction, and one surface of the cover insulating layer 14 in the thickness direction. The first resist 161 has the thickness. The first resist 161 extends in the plane direction. The first resist 161 corresponding to the joint 5 may be removed. One surface of the metal support board 10 described above includes one surface of the metal support board 10 where the opening portion 4 is to be formed, and one surface of the metal support board 10 exposed from the slit 15. The first resist is also a support material in the step (2).

The second resist 162 is disposed on the other surface of the substrate 100 with a metal support board in the thickness direction. Specifically, the second resist 162 has a second opening portion 1621. The second opening portion 1621 has the same pattern as the opening portion 4 and the joint 5. The second resist 162 has the thickness. One surface of the second resist 162 in the thickness direction is in contact with the other surface of the metal support board 10 in the frame 2 and the mounting portion 3.

Each of the first resist 161 and the second resist 162 is prepared from a dry film resist. The second resist 162 having the second opening portion 1621 is formed by photo-processing of a photosensitive dry film resist.

As shown in FIG. 4C, in the step (2), next, the metal support board 10 corresponding to the opening portion 4 and the joint 5 is etched from the other side in the thickness direction by using the etching resist 16. Specifically, an etching solution is discharged (emitted) from the other surface of the substrate 100 with a metal support board toward the metal support board 10.

Then, the metal support board 10 exposed from the second opening portion 1621 of the second resist 162 is removed by dissolving. At this time, the metal support board 10 is etched from the other surface toward one surface in the thickness direction. Therefore, the two side surfaces S defined in the opening portion 4 is formed into an inclined shape approaching each other toward one side in the thickness direction.

By etching the metal support board 10 described above, the metal support layer 11 is formed.

On the other hand, the base insulating layer 12, the conductive layer 13, and the cover insulating layer 14 corresponding to the etched portion in the metal support board 10 are supported by the first resist 161.

As shown in FIG. 4D, the etching resist 16 is removed. In the removal of the etching resist 16, for example, a stripping solution is used.

Thus, the wiring circuit board 1 is produced.

As shown in FIG. 4E, thereafter, an external board 18 and an imaging element 19 are installed and mounted on the wiring circuit board 1. The external board 18 is installed on the frame 2, and electrically connected to the first terminal 131. The imaging element 19 is mounted on the mounting portion 3, and electrically connected to the second terminal 132.

3. Function and Effect of One Embodiment

According to the method for producing the wiring circuit board 1, in the step (2), as shown in FIG. 4C, the metal support board 10 corresponding to the opening portion 4 and the joint 5 is etched from the other side in the thickness direction by using the etching resist 16. That is, the first resist 161 is disposed at one side of the base insulating layer 12, the conductive layer 13, and the cover insulating layer 14 in the thickness direction corresponding to the opening portion 4 and the joint 5. Then, the base insulating layer 12, the joint wiring 1333, and the cover insulating layer 14 included in the joint 5 are supported from one side in the thickness direction by the above-described first resist 161.

Therefore, the damage and/or the detachment are/is suppressed even when the base insulating layer 12, the joint wiring 1333, and the cover insulating layer 14 included in the joint 5 are collided with the etching solution.

Furthermore, as shown in FIG. 4C, in the step (2), the metal support layer 11 corresponding to the opening portion 4 is collided with the etching from the other side in the thickness direction, the two side surfaces S defining the opening portion 4 have the inclined shape approaching each other toward one side in the thickness direction. Therefore, the formation of the pointed portion at the other end portion of the two side surfaces S in the thickness direction is suppressed.

As shown in FIG. 1, when the ratio of the length of the first connecting portion 51A in the direction along the side 22A to the length of the side 22A is 0.3 or less, the first connecting portion 51A in the direction along the side 22A is narrowed. Then, the strength of the first connecting portion 51A in the joint 5A is reduced. Therefore, in the step (2), the joint 5A is likely to be deformed and/or detached. However, in the method for producing the wiring circuit board 1, as shown in FIG. 4C, since in the step (2), the metal support board 10 is etched from the other side in the thickness direction, while the joint 5A is supported from one side in the thickness direction by the first resist 161, it is possible to further suppress the deformation and/or the detachment of the joint 5A.

When the ratio of the length of the second connecting portion 52A in the direction along the side 32B to the length of the side 32B is 0.3 or less, the second connecting portion 52A in the direction along the side 32B is narrowed. Then, the strength of the second connecting portion 52A in the joint 5A is reduced. Therefore, in the step (2), the joint 5A is likely to be deformed and/or detached. However, in the method for producing the wiring circuit board 1, since in the step (2), the metal support board 10 is etched from the other side in the thickness direction, while the joint 5A is supported from one side in the thickness direction by the first resist 161, it is possible to further suppress the deformation and/or the detachment of the joint 5A.

4. Modified Examples

In each modified example below, the same reference numerals are provided for members and steps corresponding to each of those in the above-described embodiment, and their detailed description is omitted. Further, each modified example can achieve the same function and effect as that of one embodiment unless otherwise specified. Furthermore, one embodiment and each modified example can be appropriately used in combination.

4.1 First Modified Example

A first modified example is described with reference to FIGS. 5A to 5D.

In the first modified example, the method for producing the wiring circuit board 1 includes the step (2), a step (3), a step (4), and a step (5) in order.

4.1.1 Step (3)

Figure 5A:
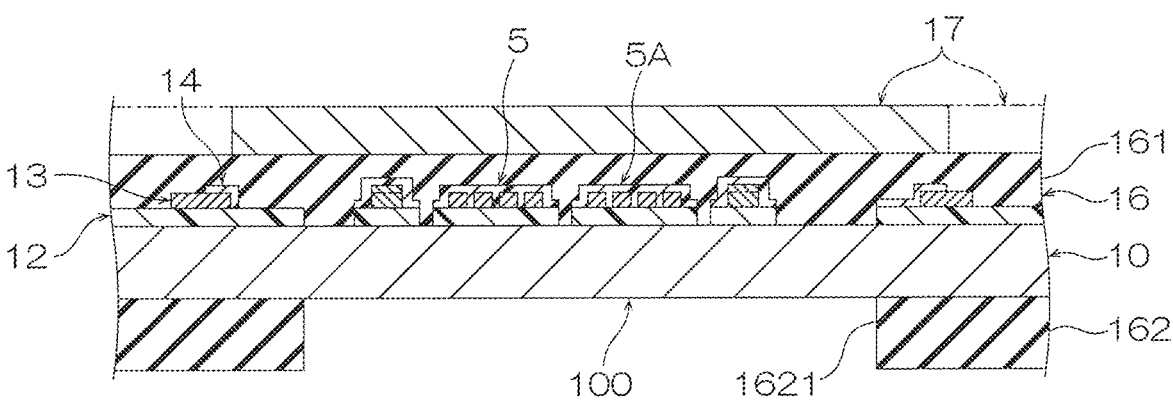
FIGS. 5A to 5D show process views of a method for producing a wiring circuit board.
Figure 5B:
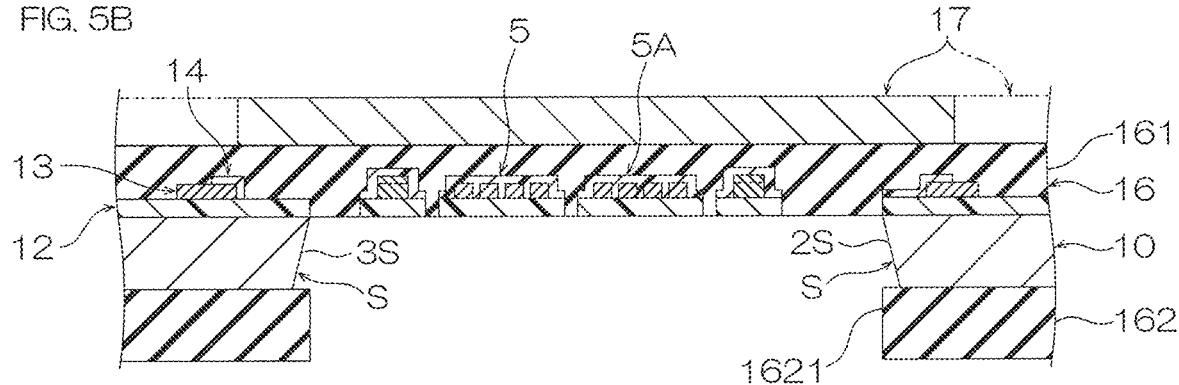

As shown in FIG. 5A, in the step (2), a patch board 17 is disposed at one side of the substrate 100 with a metal support board in the thickness direction. Specifically, the patch board 17 is applied to one surface of the first resist 161 in the thickness direction. The patch board 17 is disposed at the opposite side to the substrate 100 with a metal support board with respect to the first resist 161 in the thickness direction. The patch board 17 is overlapped with a scheduled region where at least the opening portion 4 (ref: FIG. 5B) is to be formed in the substrate 100 with a metal support board when projected in the thickness direction, and the joint 5. The patch board 17 supports the scheduled region and the joint 5 described above from one side in the thickness direction. As shown in FIG. 5A, the patch board 17 may be applied to the entire one surface of the first resist 161, in other words, may be disposed on the entire one side of the substrate 100 with a metal support board.

The patch board 17 extends in the plane direction. The patch board 17 has, for example, pressure-sensitive adhesiveness (tackiness) or non-pressure-sensitive adhesiveness. The patch board 17 preferably has the non-pressure-sensitive adhesiveness from the viewpoint of production efficiency. As a material for the patch board 17, for example, a resin is used, preferably, a non-pressure-sensitive adhesive resin is used. The thickness of the patch board 17 is not limited.

4.1.2 Step (4)

Next, as shown in FIG. 5B, in the step (4), the metal support board 10 of the substrate 100 with a metal support board to which the patch board 17 is applied is etched.

4.1.3 Step (5)

Figure 5C:
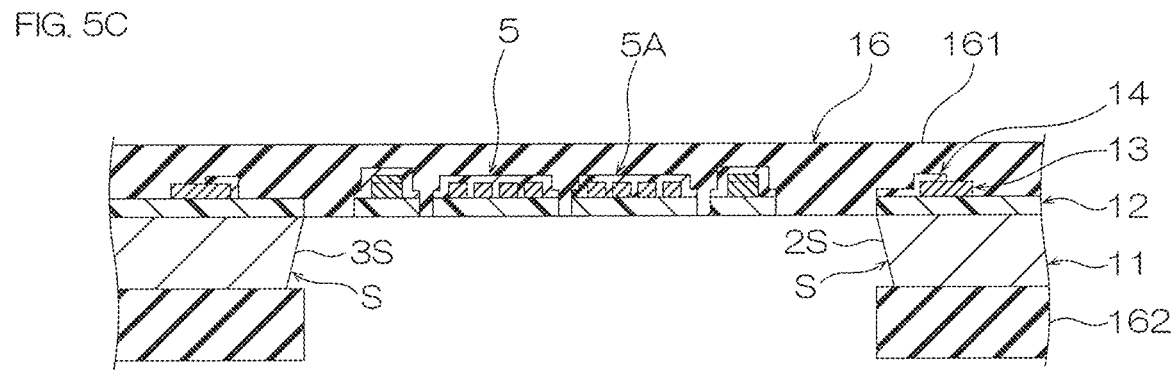

Next, as shown in FIG. 5C, in the step (5), the patch board 17 is removed.

When the patch board 17 has the non-pressure-sensitive adhesiveness, the patch board 17 is pulled up from the first resist 161 or slipped off from the first resist 161.

When the patch board 17 has the pressure-sensitive adhesiveness, the patch board 17 is peeled from the first resist 161. At this time, if necessary, a process of reducing pressure-sensitive adhesive force of the patch board 17 with respect to the first resist 161 is carried out.

Figure 5D:
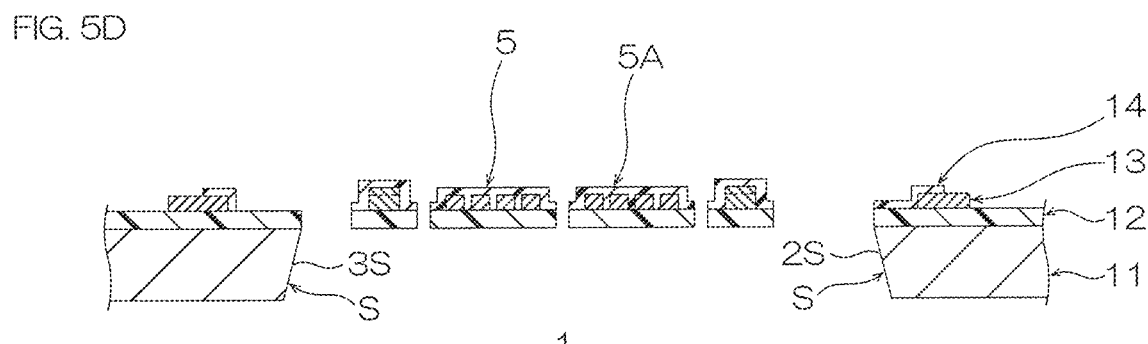

As shown in FIG. 5D, thereafter, the etching resist 16 is removed.

4.1.4 Function and Effect of First Modified Example

According to the method for producing the wiring circuit board 1 of the first modified example, as shown in FIG. 5B, in the step (4), it is possible to support the substrate 100 with a metal support board by the patch board 17. Therefore, in the step (4), it is possible to further more effectively suppress the damage and/or the detachment of the base insulating layer 12, the conductive layer 13, and the cover insulating layer 14 included in the joint 5.

When the patch board 17 has the pressure-sensitive adhesiveness, a process of reducing the pressure-sensitive adhesive force of the patch board 17 with respect to the first resist 161 is required, which may be laborious.

On the other hand, when the patch board 17 has the non-pressure-sensitive adhesiveness, it is possible to smoothly and easily remove the patch board 17 in the step (5). Therefore, it is possible to improve the production efficiency of the wiring circuit board 1.

4.2 Further Modified Example

It is also possible to carry out the step (5), while carrying out the step (4). In this case, the patch board 17 may be also provided in an etching device for carryout out the metal support board 10.

4.2 Second Modified Example

Figure 6:
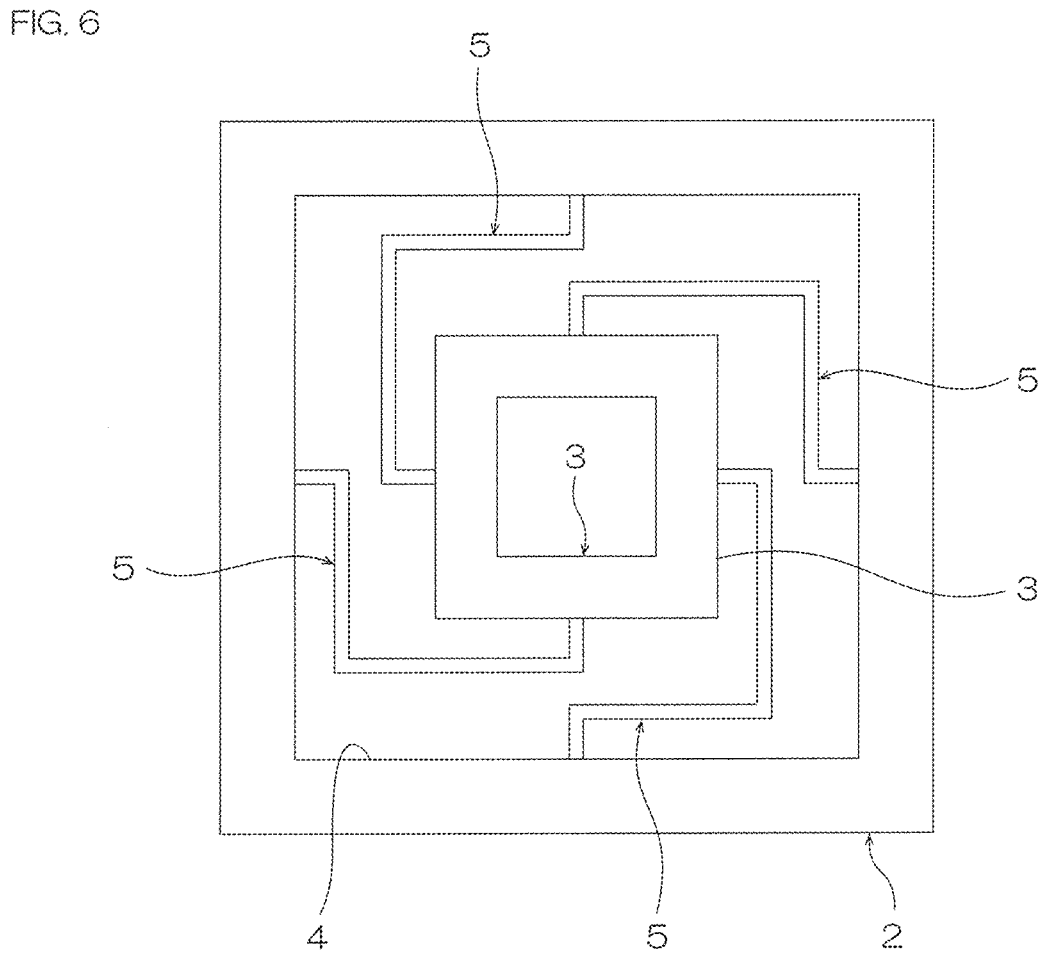
FIG. 6 shows a plan view of a wiring circuit board of a second modified example.

As shown in FIG. 6, the joint 5 may also have a linear shape or a bent shape.

4.3 Third Modified Example

Figure 7:
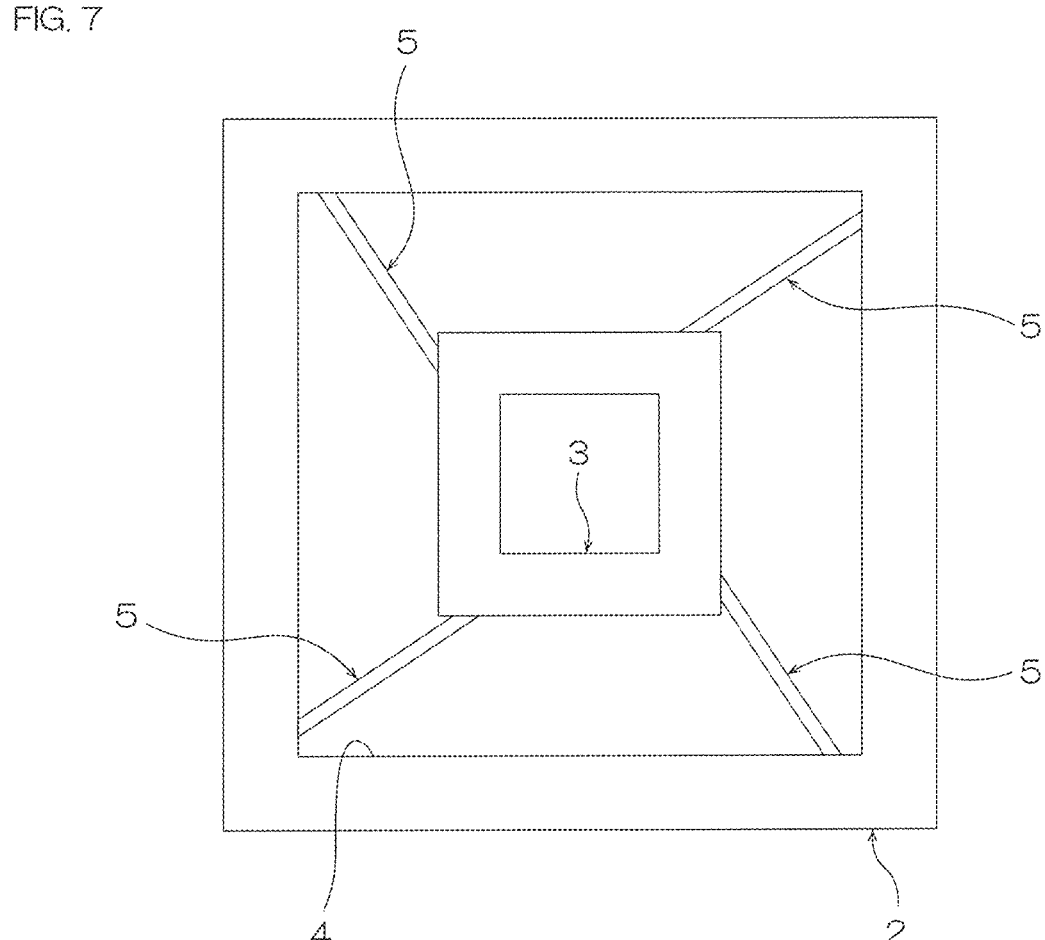
FIG. 7 shows a plan view of a wiring circuit board of a third modified example.

As shown in FIG. 7, the joint 5 may also have a linear shape. In the third modified example, the joint 5 does not have a curved shape or a bent shape, and has only a linear shape.

4.4 Fourth Modified Example

In one embodiment, the mounting portion 3 has a rectangular frame shape, and may also have a rectangular shape without having the inner peripheral edge 30.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

DESCRIPTION OF REFERENCE NUMERALS

1 Wiring circuit board
2 Frame
3 Mounting portion
4 Opening portion
5 Joint
5A, 5B, 5C, 5D Joint
10 Metal support board
11 Metal support layer
12 Base insulating layer
13 Conductive layer
14 Cover insulating layer
16 Etching resist
17 Patch Board
21 Inner peripheral edge (frame)
22A, 22B, 22C, 22D Side (frame)
31 Outer peripheral edge (mounting portion)
51, 51A, 51B, 51C, 51D First connecting portion (joint)
52, 52A, 52B, 52C, 52D Second connecting portion (joint)
100 Substrate with metal support board
S Side surface (metal support layer)

The invention claimed is:

1. A method for producing a wiring circuit board comprising:
a step (1) of producing a substrate with a metal support board including a metal support board and a step (2) of etching the metal support board in order, wherein
the wiring circuit board includes a frame, a mounting portion spaced from the frame and surrounded by the frame, an opening portion disposed between the frame and the mounting portion, and a joint connecting the frame to the mounting portion and traversing the opening portion;
each of the frame and the mounting portion includes a metal support layer, a base insulating layer, a conductive layer, and a cover insulating layer in order toward one side in a thickness direction;
the joint does not include the metal support layer, and includes the base insulating layer, the conductive layer, and the cover insulating layer in order toward one side in the thickness direction;
the substrate with a metal support board includes the metal support board including the metal support layer, the base insulating layer, the conductive layer, and the cover insulating layer; and
in the step (2), by etching the metal support board corresponding to the opening portion and the joint from the other side in the thickness direction by using an etching resist, the metal support layer is formed.

2. The method for producing a wiring circuit board according to claim 1, wherein
the step (2) includes
a step (3) of disposing a patch board at one side of the substrate with a metal support board in the thickness direction,
a step (4) of etching the metal support board, and
a step (5) of removing the patch board.

3. The method for producing a wiring circuit board according to claim 2, wherein
the patch board has non-pressure-sensitive adhesiveness.

4. The method for producing a wiring circuit board according to claim 1, wherein
the frame has a side at an inner peripheral edge of the frame,
the joint includes a first connecting portion to which the joint is connected at the side, and
a ratio (length of the first connecting portion/length of the side) of the length of the first connecting portion in a direction along the side to the length of the side is 0.3 or less.

5. The method for producing a wiring circuit board according to claim 1, wherein
the mounting portion has a side at an outer peripheral edge of the mounting portion,
the joint includes a second connecting portion to which the joint is connected at the side, and
a ratio (length of the second connecting portion/length of the side) of the length of the second connecting portion in a direction along the side to the length of the side is 0.3 or less.

* * * * *